(12) United States Patent
Izutani

(10) Patent No.: US 11,592,470 B2
(45) Date of Patent: Feb. 28, 2023

(54) INSULATION ABNORMALITY DETECTION APPARATUS

(71) Applicant: DENSO TEN Limited, Kobe (JP)

(72) Inventor: Atsushi Izutani, Kobe (JP)

(73) Assignee: DENSO TEN Limited, Kobe (JP)

( * ) Notice: Subject to any disclaimer, the term of this patent is extended or adjusted under 35 U.S.C. 154(b) by 0 days.

(21) Appl. No.: 17/365,097

(22) Filed: Jul. 1, 2021

(65) Prior Publication Data

US 2022/0120803 A1   Apr. 21, 2022

(30) Foreign Application Priority Data

Oct. 16, 2020   (JP) .............................. JP2020-175011

(51) Int. Cl.
*G01R 31/12*   (2020.01)

(52) U.S. Cl.
CPC .............................. *G01R 31/1272* (2013.01)

(58) Field of Classification Search
CPC .............. G01R 31/1272; G01R 27/025; G01R 31/007; G01R 31/28; G01R 31/006; G01R 31/40; G01R 31/3835; G01R 31/52; G01R 31/64; G01R 1/3277; G01R 31/396; G01R 35/00

See application file for complete search history.

(56) References Cited

U.S. PATENT DOCUMENTS

| | | | |
|---|---|---|---|
| 11,073,571 B2* | 7/2021 | Takamatsu | G01R 31/3835 |
| 2010/0085060 A1* | 4/2010 | Ichikawa | G01R 31/40 |
| | | | 324/503 |
| 2014/0043032 A1* | 2/2014 | Makino | G01R 31/007 |
| | | | 327/109 |
| 2015/0285851 A1* | 10/2015 | Kawamura | G01R 31/14 |
| | | | 324/509 |
| 2016/0252559 A1* | 9/2016 | Tamura | G01R 31/64 |
| | | | 324/548 |
| 2017/0160333 A1* | 6/2017 | Kawanaka | G01R 31/007 |

FOREIGN PATENT DOCUMENTS

JP   2017-133965 A   8/2017

* cited by examiner

*Primary Examiner* — Daniel R Miller
*Assistant Examiner* — Eric Sebastian Von Wald
(74) *Attorney, Agent, or Firm* — Oliff PLC

(57) ABSTRACT

A controller (1) forms an insulation measurement path and turns on a third switch connected in parallel to a capacitor, (2) after a lapse of a first time period turns off the third switch, and (3) detects an insulation abnormality based on a voltage of the capacitor measured after a lapse of a second time period after the turning off of the third switch.

8 Claims, 6 Drawing Sheets

INSULATION ABNORMALITY DETECTION APPARATUS

BACKGROUND OF THE INVENTION

Field of the Invention

The invention relates to an insulation abnormality detection apparatus and an insulation abnormality detection method.

Description of the Background Art

Recently, in a vehicle, the number of mounting ECUs (Electric Control Units) that require a power supply is increasing in association with complicated control systems. Along with the increased number of ECUs, for example, a stray capacitance stored in a vehicle body that serves as a ground tends to increase, and when an abnormality that a resistance value of an insulation resistance of the vehicle body decreases occurs, a malfunction of a load may be caused by the stray capacitance that is supplied to the load via a battery.

On the other hand, conventionally, there is a technology that detects an insulation abnormality of a vehicle based on a voltage of a flying capacitor charged in a state in which a battery, the flying capacitor, a vehicle insulation resistance, and a vehicle body ground are connected (for example, refer to Japanese Published Unexamined Patent Application No. 2017-133965).

However, there is a room for further improvement in accurately detecting the insulation abnormality of the vehicle.

SUMMARY OF THE INVENTION

According to one aspect of the invention, an insulation abnormality detection apparatus includes: a voltage detecting circuit that has (i) a battery, (ii) a capacitor connected in parallel to the battery and having first and second electrodes, (iii) two first switches respectively connected to the first and second electrodes of the capacitor on an input side of the voltage detecting circuit, (iv) two second switches respectively connected to the first and second electrodes of the capacitor on an output side of the voltage detecting circuit, and (v) a third switch connected in parallel to the capacitor; and a controller that (a) forms an insulation measurement path either by turning on a first one of the two first switches connected to the first electrode of the capacitor and a second one of the two second switches connected to the second electrode of the capacitor or by turning on a second one of the two first switches connected to the second electrode of the capacitor and a first one of the two second switches connected to the first electrode of the capacitor, (b) measures a voltage of the capacitor charged through the insulation measurement path, and (c) detects an insulation abnormality based on the voltage that is measured, wherein the controller (1) forms the insulation measurement path and turns on the third switch, (2) after a lapse of a first time period turns off the third switch, and (3) detects the insulation abnormality based on the voltage of the capacitor measured after a lapse of a second time period after the turning off of the third switch.

It is an object of the invention to provide an insulation abnormality detection apparatus and an insulation abnormality detection method capable of accurately detecting an insulation abnormality of a vehicle.

These and other objects, features, aspects and advantages of the invention will become more apparent from the following detailed description of the invention when taken in conjunction with the accompanying drawings.

DESCRIPTION OF THE EMBODIMENTS

An insulation abnormality detection apparatus and an insulation abnormality detection method disclosed in this application will be described in detail below with reference to the drawings. This invention is not limited to an embodiment described below.

Figure 1:
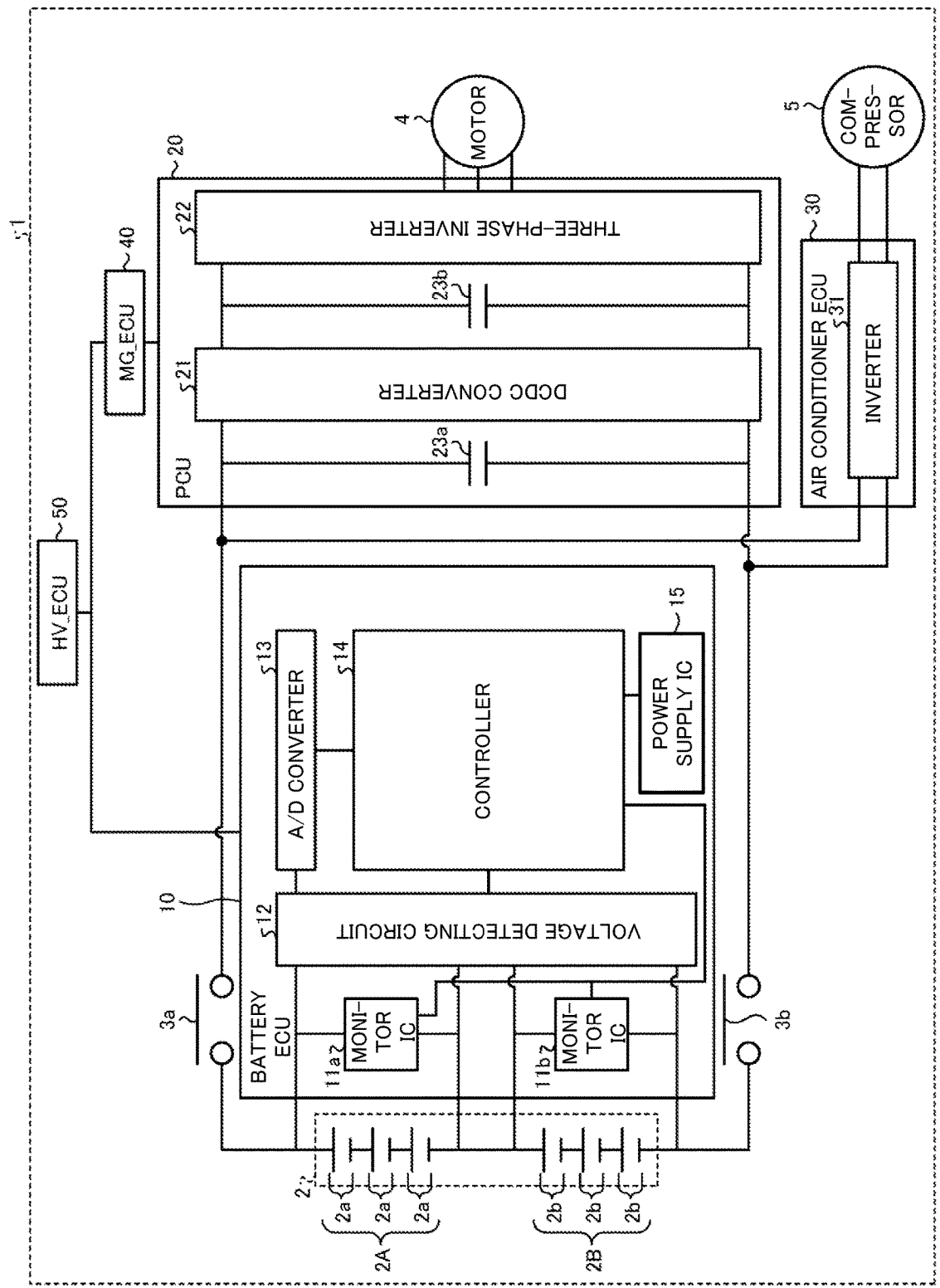
FIG. 1 illustrates one example of an in-vehicle system according to an embodiment.

FIG. 1 illustrates one example of an in-vehicle system according to the embodiment. An in-vehicle system 1, for example, is mounted on a vehicle, such as a hybrid electric vehicle (HEV), an electric vehicle (EV), or a fuel cell vehicle (FCV). The in-vehicle system 1 performs control including charging and discharging of a power supply that supplies power to a motor that is a power source of the vehicle.

The in-vehicle system 1 includes a battery 2, a system main relay (SMR) 3a, a SMR 3b, a motor 4, a compressor 5, a battery ECU (one example of the insulation abnormality detection apparatus) 10, a PCU 20, an air conditioner ECU 30, a motor generator ECU (MG_ECU) 40, and a hybrid ECU (HV_ECU) 50. An electrical component, such as the motor 4, the compressor 5, the PCU 20, the air conditioner ECU 30, or the MG_ECU 40, is one example of a load circuit. "ECU" is an abbreviation of an Electric Control Unit.

The battery 2 is the power supply (battery) insulated from a vehicle body (not shown) and is configured to include a plurality of, for example, two cell stacks 2A and 2B that are connected in series. The cell stacks 2A and 2B are respectively configured to include a plurality of, for example, three battery cells 2a and three battery cells 2b that are respectively connected in series. That is, the battery 2 is a high voltage DC power supply.

Numbers of cell stacks and battery cells are not limited to those described above or illustrated in the drawings. Moreover, for example, a lithium ion secondary battery, a nickel hydride secondary battery, and the like, may be used for the battery cell, but the battery cell is not limited to those batteries.

The SMR 3a is controlled by the HV ECU 50 to be turned on and off. While being turned on, the SMR 3a connects the PCU 20 to a highest voltage side of the battery 2. The SMR 3b is controlled by the HV ECU 50 to be turned on and off.

While being turned on, the SMR 3*b* connects the PCU 20 to a lowest voltage side of the battery 2.

The battery ECU 10 is an electronic control apparatus that monitors a state of the battery 2 and that controls the battery 2. The battery ECU 10 includes a monitor IC (integrated circuit) 11*a*, a monitor IC 11*b*, a voltage detecting circuit 12, an A/D (analog/digital) converter 13, a controller 14 and a power supply IC 15. The power supply IC 15 supplies power to the monitor IC 11*a*, the monitor IC 11*b*, the voltage detecting circuit 12, the A/D converter 13 and the controller 14.

The monitor IC 11*a* is connected to each of the plurality of the battery cells 2*a* (a connection line is omitted) so as to monitor a voltage of each battery cell 2*a*. Moreover, the monitor IC 11*a* is connected to a highest voltage side and a lowest voltage side of the cell stack 2A so as to monitor a voltage of the cell stack 2A. The monitor IC 11*b* is connected to each of the plurality of the battery cells 2*b* (a connection line is omitted) so as to monitor a voltage of each battery cell 2*b*. Moreover, the monitor IC 11*b* is connected to a highest voltage side and a lowest voltage side of the cell stack 2B so as to monitor a voltage of the cell stack 2B.

A monitor IC may be provided to each battery cell or a monitor IC may be provided to the battery 2. In a case where one monitor IC is provided to each battery cell, the controller 14 uses, as a total voltage of the battery 2, a sum of voltages of the cell stacks each of which is monitored by each monitor IC. Moreover, in a case where one monitor IC is provided to the battery 2, the controller 14 uses the total voltage of the battery 2 monitored by the monitor IC. The monitor ICs 11*a* and 11*b* are external units of the controller 14.

Configurations and operations of the voltage detecting circuit 12, the A/D (analog/digital) converter 13, and the controller 14 of the battery ECU 10 will be described in FIG. 2.

The PCU 20 boosts a voltage of the power supply to be supplied to the motor 4 and other electrical equipment of the vehicle, and also converts the voltage from DC voltage to AC voltage. As illustrated in FIG. 1, the PCU 20 is connected to positive and negative electrode sides of the battery 2. The PCU 20 includes a DCDC converter 21, a three-phase inverter 22, a low pressure-side smoothing capacitor 23*a*, and a high pressure-side smoothing capacitor 23*b*.

The air conditioner ECU 30 includes a control apparatus (not shown), and also includes an inverter 31 that converts the voltage of the power supply to be supplied to the compressor 5 from DC voltage to AC voltage.

The MG_ECU 40 is an electronic control apparatus that monitors a state of the PCU 20 and that controls the PCU 20. More specifically, the MG_ECU 40 monitors operation states of the DCDC converter 21 and the three-phase inverter 22, and also monitors charged states of the low pressure-side smoothing capacitor 23*a* and the high pressure-side smoothing capacitor 23*b*. The MG_ECU 40 obtains information on a presence or absence of boosting in the PCU 20 and the boosted voltage, and then informs the HV_ECU 50 that is an upper apparatus of the MG_ECU 40 of the information. Moreover, the MG ECU 40 controls operations of the PCU 20 based on a command from the HV ECU 50.

Next, the voltage detecting circuit 12 according to the embodiment will be described with reference to FIG. 2. FIG. 2 illustrates one example of the voltage detecting circuit 12 according to the embodiment. FIG. 2 illustrates a configuration of the voltage detecting circuit 12 to be connected to the cell stack 2A of the battery 2. However, when being connected to the cell stack 2B, the voltage detecting circuit 12 has the same configuration as in FIG. 2. In the description of FIG. 2, the cell stack 2A is referred to as the battery 2.

Figure 2:
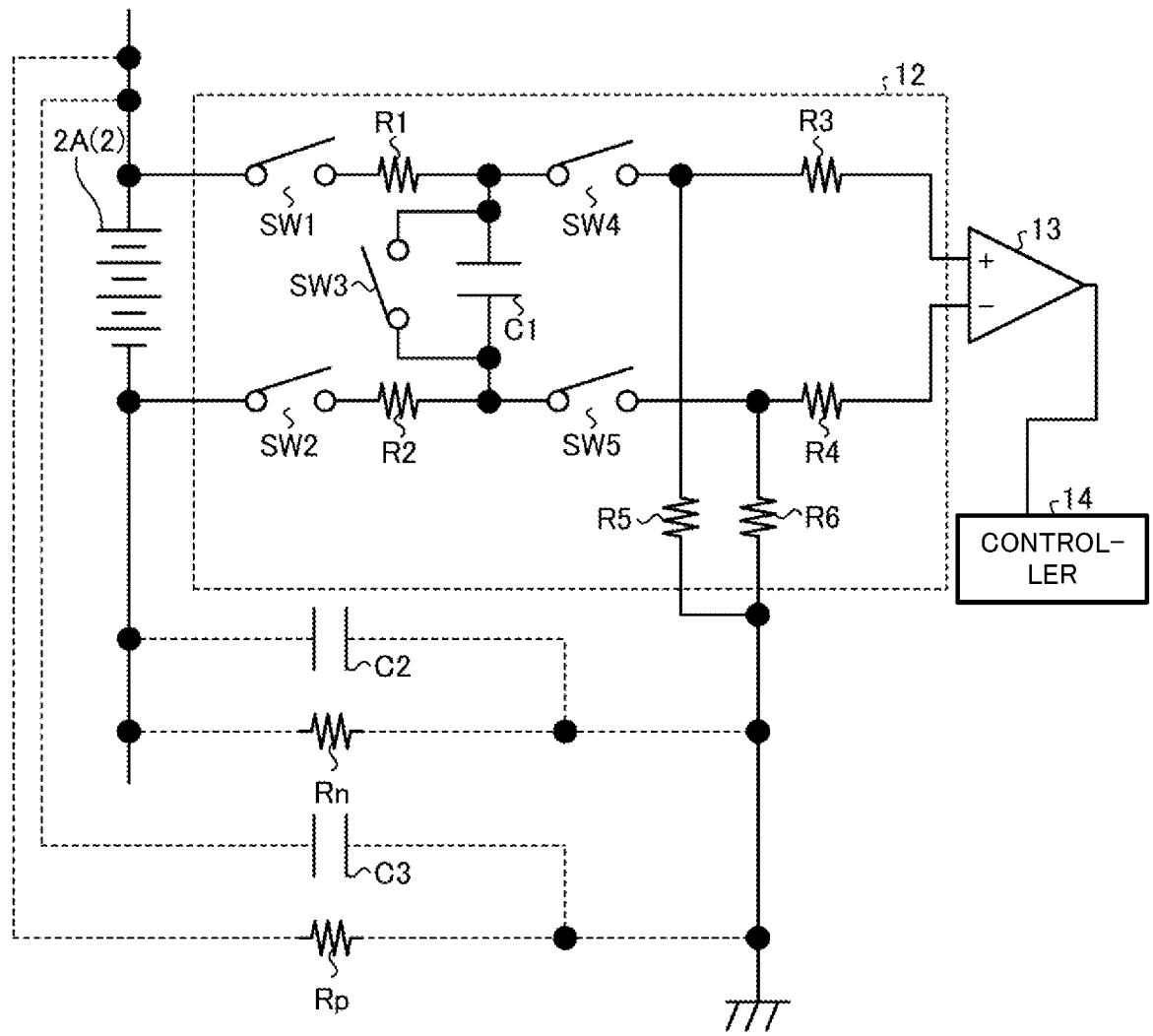
FIG. 2 illustrates one example of a voltage detecting circuit according to the embodiment.

As illustrated in FIG. 2, the voltage detecting circuit 12 includes a switch SW1 to a switch SW5, a capacitor C1, and a resistor R1 to a resistor R6. Solid state relays (SSR) may be used as the switch SW1 to the switch SW5, for example. However, the switch is not limited to the solid state relay.

Among the switch SW1 to the switch SW5, each of the switch SW1 and the switch SW2 is a first switch, each of the switch SW4 and the switch SW5 is a second switch, and the switch SW3 is a third switch.

As illustrated in FIG. 2, on a positive electrode side of the battery 2 (cell stack 2A), the switch SW1, the resistor R1, the switch SW4, and the resistor R3 are connected in series in order of proximity to the battery 2. Moreover, on a negative electrode side of the battery 2 (cell stack 2A), the switch SW2, the resistor R2, the switch SW5, and the resistor R4 are connected in series in order of proximity to the battery 2.

The capacitor C1 is connected in parallel to the battery 2 and serves as a flying capacitor. Specifically, one electrode of the capacitor C1 is connected between the resistor R1 and the switch SW4, and the other electrode is connected between the resistor R2 and the switch SW5. In other words, one electrode of the capacitor C1 is connected to the switch SW1 on an input side and is connected to the switch SW4 on an output side. The other electrode of the capacitor C1 is connected to the switch SW2 on the input side and is connected to the switch SW5 on the output side. That is, both electrodes of the capacitor C1 are respectively connected to the switch SW1 and the switch SW2 as a plurality of the first switches on the input side and the both electrodes of the capacitor C1 are respectively connected to the switch SW4 and the switch SW5 as a plurality of the second switches on the output side. Moreover, the switch SW3 is connected in parallel to the capacitor C1.

One side of the resistor R5 is connected to the switch SW4 in parallel with the resistor R3, and the other side is grounded to the vehicle body, and the like. Moreover, one side of the resistor R6 is connected to the switch SW5 in parallel with the resistor R4, and the other side is grounded to the vehicle body, and the like.

An insulation resistance Rn and a stray capacitance C2 exist in parallel between the negative electrode side of the battery 2 and one end of each of the resistor R5 and the resistor R6. Moreover, an insulation resistance Rp and a stray capacitance C3 exist in parallel between the positive electrode side of the battery 2 and the one end of each of the resistor R5 and the resistor R6. The stray capacitance C2 and the stray capacitance C3 have substantially the same value. The stray capacitance is also referred to as a common capacitance.

The resistor R3 is connected to a positive terminal of the A/D converter 13 that is configured as an amplifier, and the resistor R4 is connected to a negative terminal of the A/D converter 13. The A/D converter 13 converts an analog voltage input from the voltage detecting circuit 12 into a digital voltage, and then outputs the converted digital voltage to the controller 14.

The controller 14 is a processing apparatus that is a microcomputer and the like including, for example, a central processing unit (CPU), a random access memory (RAM) and a read only memory (ROM).

The controller 14 detect an insulation abnormality of the insulation resistances Rp and Rn by executing the insulation abnormality detection method according to the embodiment.

Here, a circuit operation of the voltage detecting circuit 12 executed by the insulation abnormality detection method according to the embodiment will be described with reference to FIG. 2. In the insulation abnormality detection method according to the embodiment, four processes (1) to (4) described below are performed.

(1) Battery voltage measurement process
(2) VRp measurement process
(3) VRn measurement process
(4) Insulation abnormality detection process In the insulation abnormality detection method according to the embodiment, especially, by devising a measurement method in (2) VRp measurement process and (3) VRn measurement process, it becomes possible to measure a voltage of the capacitor C1 from which an influence of the stray capacitances C2 and C3 is eliminated. As a result, it is possible to accurately detect the insulation abnormality.

(1) Battery Voltage Measurement Process

The battery voltage measurement process is a process of measuring a battery voltage of the battery 2. Specifically, the controller 14, first, turns on the switch SW1 and the switch SW2, and turns off the switch SW3, the switch SW4 and the switch SW5.

As a result, since a charging path is formed in order of the battery 2, the switch SW1, the resistor R1, the capacitor C1, the resistor R2, and the switch SW2, the capacitor C1 is charged by the battery 2.

Subsequently, after a lapse of a predetermined time, that is, after a completion of charging the capacitor C1, the controller 14 turns off the switch SW1 and the switch SW2, and turns on the switch SW4 and the switch SW5. As a result, since electricity is conducted from the capacitor C1 to a ground (vehicle body), a charge stored in the capacitor C1 is discharged through the resistors R5 and R6. Moreover, at this time, an analog voltage of the capacitor C1 is output to the A/D converter 13 through resistor R3 and R4, and is converted into a digital voltage by the A/D converter 13. The controller 14 measures the voltage of the capacitor C1, i.e., the battery voltage of the battery 2 based on a value of the digital voltage to be output from the A/D converter 13.

After measuring the battery voltage of the battery 2, the controller 14 completely discharge the charge of the capacitor C1 by turning on the switch SW3 and ends the battery voltage measurement process.

(2) VRp Measurement Process

After the battery voltage measurement process, the VRp measurement process is performed. The VRp measurement process may also be performed prior to the battery voltage measurement process. The VRp measurement process is a process of measuring a VRp as a voltage value for calculating a resistance value of the insulation resistance Rp on the positive electrode side of the battery 2 by forming an insulation measurement path by turning on the switch SW2 connected to an input side of the capacitor C1 and the switch SW4 connected to an output side of the capacitor C1. That is, the insulation measurement path in the VRp measurement process is formed by the negative electrode side of the battery 2, the switch SW2, the resistor R2, the capacitor C1, the switch SW4, the resistor R5, the insulation resistance Rp and the stray capacitance C3, and the positive electrode side of the battery 2. By forming this insulation measurement path, the voltage (VRp) according to the resistance value of the insulation resistance Rp is charged in the capacitor C1. In this embodiment, since an elimination operation for eliminating the stray capacitance C3 flowing through the capacitor C1 is performed prior to a measurement operation of this VRp, it becomes possible to measure the VRp from which the influence of the stray capacitance C3 is eliminated.

Specifically, the controller 14, as the elimination operation, turns on the switch SW2, the switch SW3, and the switch SW4. Since the switch SW3 is turned on in a discharge process that has been performed at an end of the battery voltage measurement process, the switch SW3 continues to be turned on in the elimination operation.

The controller 14 maintains a state in which the switch SW2, the switch SW3, and the switch SW4 are turned on for a predetermined time period (a first time period). That is, the controller 14 forms the insulation measurement path by turning on the switch SW2 as the first switch and the switch SW4 as the second switch and performs the elimination operation in which the switch SW3 as the third switch is turned on only for the first time period.

As a result, since the insulation measurement path passes through not the capacitor C1 but the switch SW3, a charge of the stray capacitance C3 is discharged (eliminated) without being charged in the capacitor C1.

After the elimination operation, the measurement operation of the VRp is performed. Specifically, after a lapse of the first time period, after the controller 14 controls the A/D converter 13 to convert the voltage of the capacitor C1 by turning on the switch SW4 and the switch SW5, the controller 14 turns off the switch SW3. Subsequently, the controller 14 forms the insulation measurement path by turning on the switch SW2 and switch SW4 and maintains a state in which the switch SW3 is turned off for a predetermined time period (a second time period). In this case, when the insulation resistance Rp is normal (the resistance value is sufficiently large), since the insulation measurement path does not conduct the electricity through the insulation resistance Rp, the capacitor C1 is not charged. When the resistance value is lowered due to the abnormality of the insulation resistance Rp, such as a deterioration, since the insulation measurement path conducts the electricity through the insulation resistance Rp, the capacitor C1 is charged.

Since the controller 14, after a lapse of the second time period, turns off the switch SW2 and turns on the switch SW4 and the switch SW5, the controller 14 controls the A/D converter 13 to A/D convert the voltage of the capacitor C1 and measures the A/D converted voltage as the VRp. The measured VRp is used in the insulation abnormality detection process as a subsequent step.

That is, the controller 14 detects the insulation abnormality based on the VRp that is the voltage of the capacitor C1 measured after the lapse of the second time period after turning off the switch SW3 as the third switch.

After measuring the VRp, the controller 14 completely discharges the charge of the capacitor C1 by turning on the switch SW3 and ends the VRp measurement process. That is, the switch SW3 as the third switch serves as both a switch for eliminating the charge of the stray capacitance C3 and a discharge switch for discharging the charge of the capacitor C1. As a result, since it is not necessary to provide each switch, it is possible to reduce costs.

(3) VRn Measurement Process

After the VRp measurement process, the VRn measurement process is performed. The VRn measurement process is a process of measuring a VRn as a voltage value for calculating a resistance value of the insulation resistance Rn of the battery 2 on the negative electrode side by forming the insulation measurement path by turning on the switch SW1 connected to the input side of the capacitor C1 and the switch SW5 connected to the output side of the capacitor C1. That is, the insulation measurement path in the VRn measurement process is formed by the positive electrode side of the battery 2, the switch SW1, the resistor R1, the capacitor C1, the switch SW5, the resistor R6, the insulation resistance Rn, the stray capacitance C2, and the negative electrode side of the battery 2. By forming this insulation measurement path, the voltage (VRn) according to the resistance value of the insulation resistance Rn is charged in the capacitor C1. In this embodiment, in the same manner as the VRp measurement process, since an elimination operation for eliminating the stray capacitance C2 flowing through the capacitor C1 is performed prior to a measurement operation of the VRn, it becomes possible to measure the VRn from which the influence of the stray capacitance C2 is eliminated.

Specifically, the controller 14, as the elimination operation, turns on the switch SW1, the switch SW3, and the switch SW5. Since the switch SW3 is turned on in the discharge process that has been performed at an end of the VRp measurement process, the switch SW3 continues to be turned on in the elimination operation.

The controller 14 maintains a state in which the switch SW1, the switch SW3, and the switch SW5 are turned on for a predetermined time period (the first time period). That is, the controller 14 forms the insulation measurement path by turning on the switch SW1 as the first switch and the switch SW5 as the second switch and performs the elimination operation in which the switch SW3 as the third switch is turned on only for the first time period.

As a result, since the insulation measurement path passes through not the capacitor C1 but the switch SW3, a charge of the stray capacitance C2 is discharged (eliminated) without being charged in the capacitor C1.

After the elimination operation, the measurement operation of the VRn is performed. Specifically, since the controller 14, after the lapse of the first time period, turns on the switch SW4 and the switch SW5, the controller 14 controls the A/D converter 13 to convert the voltage of the capacitor C1 and then turns off the switch SW3. Subsequently, the controller 14 forms the insulation measurement path by turning on the switch SW1 and switch SW5 and maintains a state in which the switch SW3 is turned off for a predetermined time period (the second time period). In this case, when the insulation resistance Rn is normal (the resistance value is sufficiently large), since the insulation measurement path does not conduct the electricity through the insulation resistance Rn, the capacitor C1 is not charged. When the resistance value is lowered due to the abnormality of the insulation resistance Rn, such as a deterioration, since the insulation measurement path conducts the electricity through the insulation resistance Rn, the capacitor C1 is charged.

Since the controller 14, after the lapse of the second time period, turns off the switch SW1 and turns on the switch SW4 and the switch SW5, the controller 14 controls the A/D converter 13 to A/D convert the voltage of the capacitor C1 and measures the A/D converted voltage as the VRn. The measured VRn is used in the insulation abnormality detection process as the subsequent step.

That is, the controller 14 detects the insulation abnormality based on the VRn that is the voltage of the capacitor C1 measured after the lapse of the second time period after turning off the switch SW3 as the third switch.

After measuring the VRn, the controller 14 completely discharges the charge of the capacitor C1 by turning on the switch SW3 and ends the VRn measurement process. That is, the switch SW3 as the third switch serves as both a switch for eliminating the charge of the stray capacitance C2 and a discharge switch for discharging the charge of the capacitor C1. As a result, since it is not necessary to provide each switch, it is possible to reduce costs.

Figure 3:
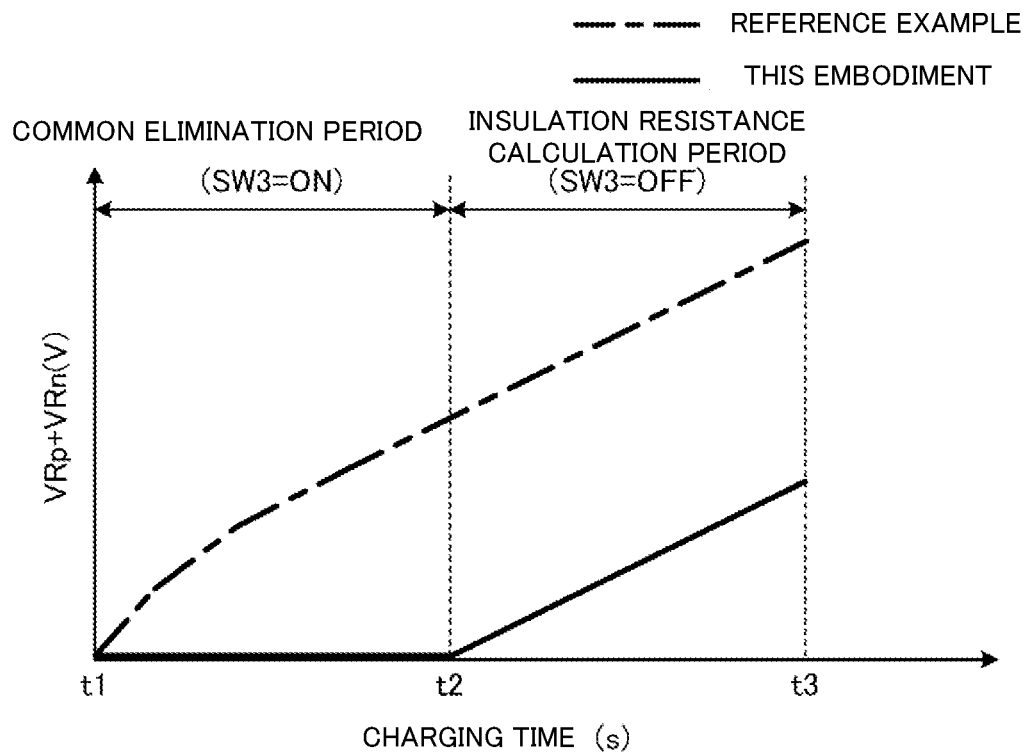
FIG. 3 illustrates a voltage value of VRp and VRn to be measured.

Here, the voltage value of VRp and VRn to be measured by the VRp measurement process and the VRn measurement process will be described with reference to FIG. 3. FIG. 3 illustrates the voltage value of VRp and VRn to be measured. FIG. 3 shows a total sum of the VRp and the VRn on a vertical axis and shows a charging time of the capacitor C1 on a horizontal axis. Although the total sum of the VRp and VRn is shown in FIG. 3, the VRp and the VRn may be shown respectively and separately.

Moreover, a "common elimination period" shown in FIG. 3 is the first time period, and an "insulation resistance calculation period" is the second time period. FIG. 3 shows, as a reference example, the total sum of the VRp and the VRn to be detected in the voltage detecting circuit that does not include the switch SW3 as the third switch.

As illustrated in FIG. 3, in the reference example, since a charge of a stray capacitance is charged in a capacitor, in the common elimination period between a time t1 and a time t2, charges of a battery and the stray capacitance are stored in the capacitor. As a result, for example, when the stray capacitance increases, since the charges stored in the capacitor increase, there is a possibility that a battery voltage is not accurately measured depending on the capacitance of the capacitor.

Therefore, in this embodiment, since the controller 14 forms the insulation measurement path and turns on the switch SW3 in the common elimination period (period between the time t1 and the time t2) that is influenced by the charges of the stray capacitances C2 and C3, the charge of the stray capacitance C2 is not stored in the capacitor C1. As a result, as illustrated in FIG. 3, in the common elimination period, since the switch SW3 is turned on, the capacitor C1 is not charged, and thus, the voltage of the capacitor C1 becomes substantially zero.

After a lapse of the common elimination period, that is, at the time t2 after completely discharging the charges of the stray capacitances C2 and C3, since the controller 14 forms the insulation measurement path and turns off the switch SW 3 after controlling the A/D converter 13 to A/D convert the voltage of the capacitor C1, the controller 14 starts charging of the capacitor C1. That is, if the voltage detecting circuit 12 does not include the switch SW3, the common elimination period as the first time period is a time required from formation of the insulation measurement path to a completion of charging the stray capacitance C2. As a result, it is possible to store only the charge of the battery 2 in the capacitor C1 by eliminating the influence of the stray capacitances C2 and C3.

In the insulation resistance calculation period (period between the time t2 and a time t3) as the second time period, the controller 14 charges the capacitor C1 by continuing to turn off the switch SW3. That is, the second time period is a time required for a completion of charging the capacitor C1 by the battery 2.

The controller 14, at the time t3 after a lapse of the insulation resistance calculation period, controls the A/D converter 13 to A/D convert the voltage of the capacitor C1 and detects the abnormality of the insulation resistances Rp and Rn in the (4) insulation abnormality detection process as described later based on the A/D converted voltage of the capacitor C1.

As described above, in the insulation abnormality detection method according to the embodiment, by turning on the switch SW3 in the common elimination period, it becomes possible to measure the voltage of the capacitor C1 from which the influence of the stray capacitances C2 and C3 is eliminated. That is, according to the insulation abnormality detection method according to the embodiment, it is possible to accurately detect the abnormality of the insulation resistances Rp and Rn.

As described above, in the insulation abnormality detection method according to the embodiment, since the charge of the stray capacitance C2 is not stored in the capacitor C1, the capacitance of the capacitor C1 is reduced by the stray capacitance C2. In other words, the capacitance of the capacitor C1 is set as the capacitance from which the stray capacitance C2 is eliminated. As a result, it is possible to reduce the cost of the capacitor C1.

(4) Insulation Abnormality Detection Process

The insulation abnormality detection process is a process of detecting the abnormality of the insulation resistance Rn based on the measured VRp and the VRn. Specifically, the controller 14 calculates a voltage (Vt2) of the capacitor C1 A/D converted at the time t2 and an increase rate (inclination) of a voltage (Vt3) of the capacitor C1 A/D converted at the time t3, as shown in FIG. 3. That is, the increase rate is calculated by (Vt3−Vt2)/(t3−t2). When the increase rate is less than a predetermined threshold value, the controller 14 determines that the insulation resistances Rp and Rn are normal. When the increase rate is the predetermined threshold value or more, the controller 14 determines that the insulation resistances Rp and Rn are abnormal. That is, the controller 14 detects the insulation abnormality based on the inclination of the VRp and the VRn in the insulation resistance calculation period (period between the time t2 and the time t3) illustrated in FIG. 3.

The controller 14 may detect the insulation abnormality by calculating the increase rate of the sum of the VRp and VRn or by calculating the increase rate of each of the VRp and the VRn.

The controller 14 does not necessarily determine the insulation abnormality by the increase rate and may determine the insulation abnormality depending on whether or not the sum (or each value) of the VRp and the VRn is the predetermined threshold value or more.

The controller 14 may detect the insulation abnormality without A/D converting the voltage of the capacitor C1 at the time t2. In this case, the controller 14 may calculate the increase rate described above as Vt2=0.

The controller 14 may detect that a stuck-open abnormality of the switch SW3 has occurred based on the voltage of the capacitor C1. Specifically, the controller 14 measures the voltage of the capacitor C1 after the lapse of the first time period (common elimination period shown in FIG. 3). When the voltage has a predetermined value or more, the controller 14 detects that the stuck-open abnormality of the switch SW3 as the third switch has occurred.

That is, when the voltage that is supposed to be zero after the lapse of the common elimination period is not zero, the controller 14 determines that the capacitor C1 is unintentionally charged due to the abnormality that the switch SW3 is not turned on and detects that the stuck-open abnormality of the switch SW3 has occurred. As a result, it is possible to accurately detect that the stuck-open abnormality of the switch SW3 has occurred.

The controller 14, prior to the common elimination period as the first time period, may perform a process of measuring the stray capacitance C2 and determine a length of the common elimination period according to the stray capacitance C2. Specifically, the controller 14, in the process (2) or (3) described above, forms the insulation measurement path before turning on the switch SW3 as the third switch for the first time period, and measures the voltage of the capacitor C1 that is charged by turning off the switch SW3 for the first time period. Since such a voltage is charged in the stray capacitance C2, the first time period is determined according to the stray capacitance C2 expected based on the voltage.

As a result, since the length of the common elimination period as the first time period is accurately determined, it is possible to accurately prevent the charge of the stray capacitance C2 from remaining in the insulation resistance calculation period due to the length of the first time period that is longer than necessary or that is too short, for example.

Figure 4:
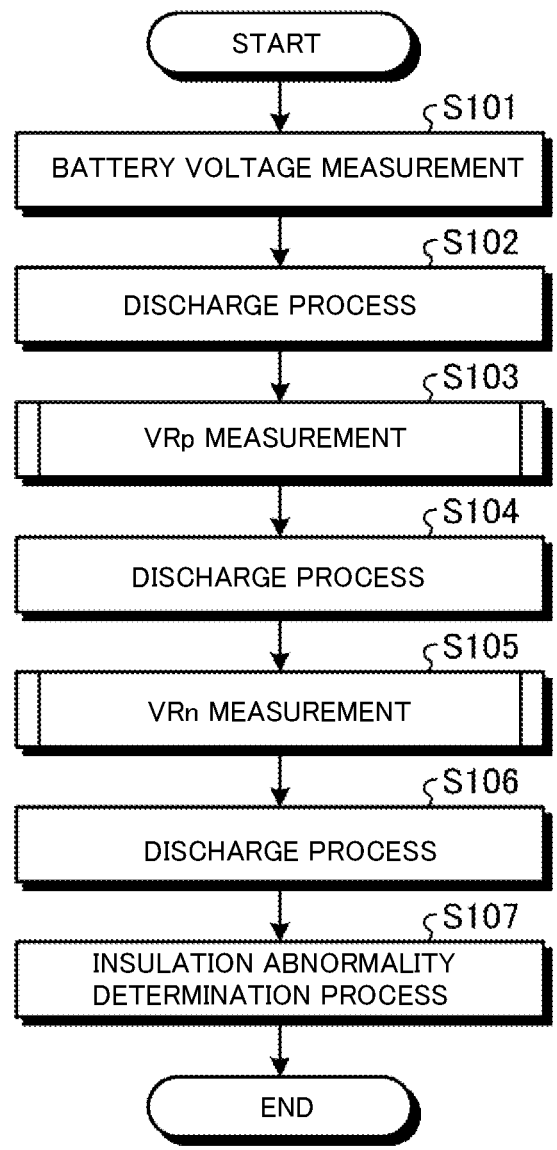
FIG. 4 is a flowchart illustrating a processing procedure of an overall process executed by a battery ECU according to the embodiment.
Figure 5:
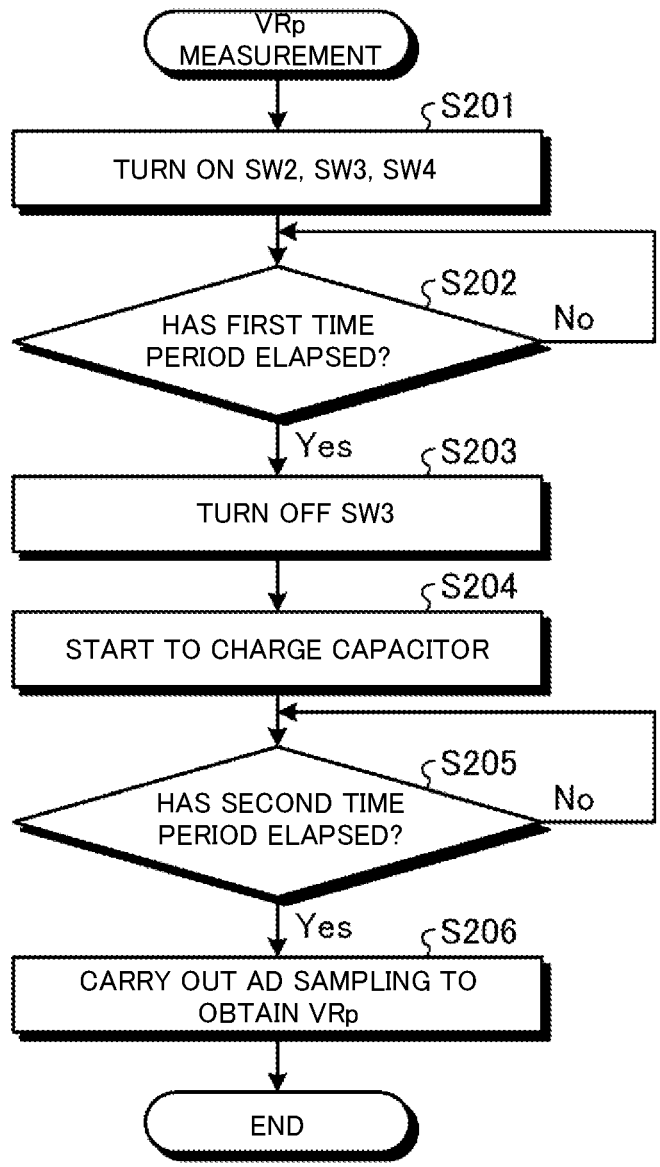
FIG. 5 is a flowchart illustrating a processing procedure of a VRp measurement process executed by the battery ECU according to the embodiment.
Figure 6:
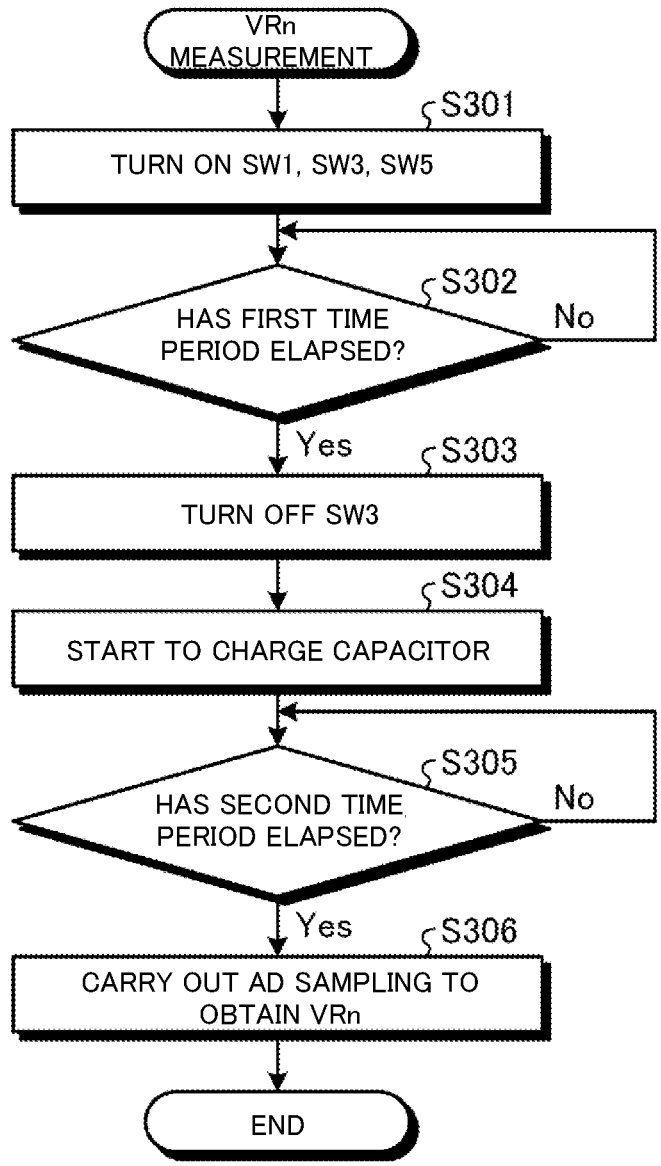
FIG. 6 is a flowchart illustrating a processing procedure of a VRn measurement process executed by the battery ECU according to the embodiment.

Next, a process executed by the battery ECU 10 as the insulation abnormality detection apparatus according to the embodiment will be described with reference to FIG. 4 to FIG. 6. FIG. 4 is a flowchart illustrating a processing procedure of an overall process executed by the battery ECU 10 according to the embodiment. FIG. 5 is a flowchart illustrating a processing procedure of the VRp measurement process executed by the battery ECU 10 according to the embodiment. FIG. 6 is a flowchart illustrating a processing procedure of the VRn measurement process executed by the battery ECU 10 according to the embodiment.

First, the processing procedure of the overall process will be described with reference to FIG. 4.

As illustrated in FIG. 4, the controller 14 of the battery ECU 10 controls the voltage detecting circuit 12 to measure the battery voltage of the battery 2 (a step S101). Subsequently, the controller 14 performs the discharge process of discharging the charge of the capacitor C1 after the battery voltage measurement process (a step S102).

Subsequently, the controller 14 controls the voltage detecting circuit 12 to perform the VRp measurement process (a step S103). Subsequently, the controller 14 performs the discharge process of discharging the charge of the capacitor C1 after the VRp measurement process (a step S104).

Subsequently, the controller 14 controls the voltage detecting circuit 12 to perform the VRn measurement process (a step S105). Subsequently, the controller 14 performs the discharge process of discharging the charge of the capacitor C1 after the VRn measurement process (a step S106).

Subsequently, the controller 14 performs the insulation abnormality detection process of detecting the insulation abnormality of the insulation resistance Rn based on the measured VRp and VRn (a step S107) and ends the process.

Next, the processing procedure of the VRp measurement process will be described with reference to FIG. 5.

As illustrated in FIG. 5, the controller 14 turns on the switch SW2, the switch SW3 and the switch SW4 in the voltage detecting circuit 12 (a step S201). Since the switch SW3 has already been turned on in the discharge process as a previous step (the step S102 illustrated in FIG. 4), the switch SW3 continues to be turned on in the step S201.

Subsequently, the controller 14 determines whether or not the first time period has elapsed after turning on the switch SW2, the switch SW3 and switch SW4 (a step S202). When the first time period has not elapsed (No in the step S202), the controller 14 repeatedly executes the step S202 until the first time period elapses.

When the first time period has elapsed (Yes in the step S202), the controller 14 controls the A/D converter 13 to A/D convert the voltage of the capacitor C1 and turns off the switch SW3 (a step S203). As a result, charging of the capacitor C1 is started (a step S204).

Subsequently, the controller 14 determines whether or not the second time period has elapsed after turning off the switch SW3 (a step S205). When the second time period has not elapsed (No in the step S205), the controller 14 repeatedly executes the step S205 until the second time period elapses.

When the second time period has elapsed (Yes in the step S205), the controller 14 controls the A/D converter 13 to carry out an AD sampling to obtain the VRp (a step S206) and ends the process.

Next, the processing procedure of the VRn measurement process will be described with reference to FIG. 6.

As illustrated in FIG. 6, the controller 14 turns on the switch SW1, the switch SW3 and the switch SW5 in the voltage detecting circuit 12 (a step S301). Since the switch SW3 has already been turned on in the discharge process as a previous step (the step S104 illustrated in FIG. 4), the switch SW3 continues to be turned on in the step S301.

Subsequently, the controller 14 determines whether or not the first time period has elapsed after turning on the switch SW1, the switch SW3 and the switch SW5 (a step S302). When the first time period has not elapsed (No in the step S302), the controller 14 repeatedly executes the step S302 until the first time period elapses.

When the first time period has elapsed (Yes in the step S302), the controller 14 controls the A/D converter 13 to A/D convert the voltage of the capacitor C1 and turns off the switch SW3 (a step S303). As a result, charging of the capacitor C1 is started (a step S304).

Subsequently, the controller 14 determines whether or not the second time period has elapsed after turning off the switch SW3 (a step S305). When the second time period has not elapsed (No in the step S305), the controller 14 repeatedly executes the step S305 until the second time period elapses.

When the second time period has elapsed (Yes in the step S305), the controller 14 controls the A/D converter 13 to carry out the AD sampling to obtain the VRp (a step S306) and ends the process.

As described above, the insulation abnormality detection apparatus (battery ECU 10) according to the embodiment includes the voltage detecting circuit 12 and the controller 14. The voltage detecting circuit 12 has the battery 2, the capacitor C1 connected in parallel to the battery 2 and having first and second electrodes, two first switches (switches SW1 and SW2) respectively connected to the first and second electrodes of the capacitor C1 on the input side of the voltage detecting circuit 12, two second switches (switches SW4 and 5) respectively connected to the first and second electrodes of the capacitor C1 on the output side of the voltage detecting circuit 12, and the third switch (switch SW3) connected in parallel to the capacitor C1. The controller 14 forms the insulation measurement path either by turning on a first one of the two first switches connected to the first electrode of the capacitor C1 and a second one of the two second switches connected to the second electrode of the capacitor C1 or by turning on a second one of the two first switches connected to the second electrode of the capacitor and a first one of the two second switches connected to the first electrode of the capacitor C1, measures the voltage of the capacitor C1 charged through the insulation measurement path, and detects the insulation abnormality based on the voltage that is measured. The controller 14 forms the insulation measurement path and turns on the third switch, after the lapse of the first time period turns off the third switch, and detects the insulation abnormality based on the voltage of the capacitor C1 measured after the lapse of the second time period after the turning off of the third switch. As a result, it is possible to accurately detect the insulation abnormality of the vehicle.

It is possible for a person skilled in the art to easily come up with more effects and modifications. Thus, a broader modification of this invention is not limited to specific description and typical embodiments described and expressed above. Therefore, various modifications are possible without departing from the general spirit and scope of the invention defined by claims attached and equivalents thereof.

While the invention has been shown and described in detail, the foregoing description is in all aspects illustrative and not restrictive. It is therefore understood that numerous other modifications and variations can be devised without departing from the scope of the invention.

What is claimed is:

1. An insulation abnormality detection apparatus comprising:
a voltage detecting circuit that has (i) a battery, (ii) a capacitor connected in parallel to the battery and having first and second electrodes, (iii) two first switches respectively connected to the first and second electrodes of the capacitor on an input side of the voltage detecting circuit, (iv) two second switches respectively connected to the first and second electrodes of the capacitor on an output side of the voltage detecting circuit, and (v) a third switch connected in parallel to the capacitor, a first end of the third switch connected to the first electrode of the capacitor, a second end of the third switch connected to the second electrode of the capacitor, and when the third switch is turned on, the capacitor being short-circuited so that the capacitor is not charged; and
a controller that (a) forms an insulation measurement path either by turning on a first one of the two first switches connected to the first electrode of the capacitor and a second one of the two second switches connected to the second electrode of the capacitor or by turning on a second one of the two first switches connected to the second electrode of the capacitor and a first one of the two second switches connected to the first electrode of the capacitor, (b) measures a voltage of the capacitor charged through the insulation measurement path, and (c) detects an insulation abnormality based on the voltage that is measured, wherein
the controller (1) forms the insulation measurement path and turns on the third switch, (2) after a lapse of a first time period turns off the third switch, and (3) detects the insulation abnormality based on the voltage of the capacitor measured after a lapse of a second time period after the turning off of the third switch.

2. The insulation abnormality detection apparatus according to claim 1, wherein
the first time period is a time required from formation of the insulation measurement path to a completion of charging of a stray capacitance.

3. The insulation abnormality detection apparatus according to claim 2, wherein
the controller forms the insulation measurement path before turning on the third switch for the first time period and measures the voltage of the capacitor that is charged upon turning on the third switch, and determines the first time period according to the stray capacitance that is expected based on the voltage that is measured before turning on the third switch.

4. The insulation abnormality detection apparatus according to claim 2, wherein
the stray capacitance is eliminated from a capacitance of the capacitor.

5. The insulation abnormality detection apparatus according to claim 1, wherein
the controller measures the voltage of the capacitor after the lapse of the first time period, and when the voltage that is measured has a predetermined value or more, the controller detects that a stuck-open abnormality of the third switch has occurred.

6. The insulation abnormality detection apparatus according to claim 1, wherein
the third switch serves as both a switch for eliminating a charge of a stray capacitance and a discharge switch for discharging the capacitor.

7. An insulation abnormality detection method executed by an insulation abnormality detection apparatus that includes a voltage detecting circuit that has (i) a battery, (ii) a capacitor connected in parallel to the battery and having first and second electrodes, (iii) two first switches respectively connected to the first and second electrodes of the capacitor on an input side of the voltage detecting circuit, (iv) two second switches respectively connected to the first and second electrodes of the capacitor on an output side of the voltage detecting circuit, and (v) a third switch connected in parallel to the capacitor, a first end of the third switch connected to the first electrode of the capacitor, a second end of the third switch connected to the second electrode of the capacitor, and when the third switch is turned on, the capacitor being short-circuited so that the capacitor is not charged, the method comprising steps of:
(a) forming an insulation measurement path either by turning on a first one of the two first switches connected to the first electrode of the capacitor and a second one of the two second switches connected to the second electrode of the capacitor or by turning on a second one of the two first switches connected to the second electrode of the capacitor and a first one of the two second switches connected to the first electrode of the capacitor;
(b) measuring a voltage of the capacitor charged through the insulation measurement path; and
(c) detecting an insulation abnormality based on the voltage that is measured, wherein
(1) the insulation measurement path is formed and the third switch is turned on, (2) after a lapse of a first time period the third switch is turned off and (3) the insulation abnormality is detected based on the voltage of the capacitor measured after a lapse of a second time period after the turning off of the third switch.

8. An insulation abnormality detection method executed by an insulation abnormality detection apparatus that includes a voltage detecting circuit that has (i) a battery, (ii) a capacitor connected in parallel to the battery and having first and second electrodes, (iii) two first switches respectively connected to the first and second electrodes of the capacitor on an input side of the voltage detecting circuit, (iv) two second switches respectively connected to the first and second electrodes of the capacitor on an output side of the voltage detecting circuit, and (v) a third switch connected in parallel to the capacitor, the method comprising steps of:
(a) forming an insulation measurement path either by turning on a first one, but not a second one, of the two first switches connected to the first electrode of the capacitor and a second one, but not a first one, of the two second switches connected to the second electrode of the capacitor or by turning on the second one, but not the first one, of the two first switches connected to the second electrode of the capacitor and the first one, but not the second one, of the two second switches connected to the first electrode of the capacitor;
(b) measuring a voltage of the capacitor charged through the insulation measurement path; and
(c) detecting an insulation abnormality based on the voltage that is measured, wherein
(1) the insulation measurement path is formed and the third switch is turned on, (2) after a lapse of a first time period the third switch is turned off and (3) the insulation abnormality is detected based on the voltage of the capacitor measured after a lapse of a second time period after the turning off of the third switch while forming the insulation measurement path formed in (1) and maintaining the third switch turned off.

\* \* \* \* \*